(12) United States Patent
Brunnbauer et al.

(10) Patent No.: US 8,158,046 B2
(45) Date of Patent: Apr. 17, 2012

(54) MOLD APPARATUS AND METHOD

(75) Inventors: Markus Brunnbauer, Lappersdorf (DE); Edward Fuergut, Dasing (DE); Daniel Porwol, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 266 days.

(21) Appl. No.: 11/733,460

(22) Filed: Apr. 10, 2007

(65) Prior Publication Data

US 2007/0235897 A1    Oct. 11, 2007

(30) Foreign Application Priority Data

Apr. 10, 2006   (DE) .................. 10 2006 017 116

(51) Int. Cl.
*H01L 21/56* (2006.01)
(52) U.S. Cl. ................. 264/272.17; 425/405.1
(58) Field of Classification Search ............. 264/272.17; 425/405.1
See application file for complete search history.

(56) References Cited

U.S. PATENT DOCUMENTS

| 5,516,470 | A | * | 5/1996 | Larsson | 264/39 |
| 5,874,324 | A | * | 2/1999 | Osada | 438/124 |
| 2001/0040306 | A1 | * | 11/2001 | Austin et al. | 264/102 |
| 2002/0056942 | A1 | * | 5/2002 | Seng et al. | 264/272.17 |
| 2003/0102590 | A1 | * | 6/2003 | Pickutoski et al. | 264/102 |
| 2006/0073294 | A1 | * | 4/2006 | Hutchinson et al. | 428/35.7 |

FOREIGN PATENT DOCUMENTS

| DE | 8501780 | 7/1986 |
| DE | 4430762 | 3/1996 |

* cited by examiner

*Primary Examiner* — Matthew Daniels
*Assistant Examiner* — John Robitaille
(74) *Attorney, Agent, or Firm* — Dicke, Billig & Czaja, PLLC

(57) ABSTRACT

An apparatus and method for producing an article by molding is disclosed. In one embodiment, the apparatus includes a mold with an upper part, a lower part and at least one mold cavity, and has a vacuum clamping ring with a least one closable vent, which is arranged between the upper part and the lower part.

11 Claims, 2 Drawing Sheets

MOLD APPARATUS AND METHOD

CROSS-REFERENCE TO RELATED APPLICATIONS

This Utility Patent Application claims priority to German Patent Application No. DE 10 2006 017 116.0, filed Apr. 10, 2006, which is incorporated herein by reference.

BACKGROUND

The invention relates to an apparatus for producing an article from a thermoplastic or thermosetting material by using a molding technique. It also relates to a method for producing such an article and to a method for packaging semiconductor devices.

Molding techniques or injection-molding methods are widely used for processing plastics. With them, many different articles can be produced, for example from thermoplastic or thermosetting materials. The techniques of transfer molding and compression molding are used particularly often.

In the case of compression molding, the molding material, which may for example take the form of a paste or a quantity of pellets and is generally preheated, is introduced into an open, usually heated mold cavity, which is subsequently closed. The molding material is pressed into the mold by the effect of a pressure and fills it completely. The molding material remains in the mold until it has completely cured.

In the case of transfer molding, a defined quantity of the molding material, typically a thermosetting material, is filled into the otherwise closed mold cavity through a gate. During transfer molding, the walls of the mold are typically heated to a temperature above the melting temperature of the molding material in order to obtain good flow properties of the material within the cavity.

A large number of different thermoplastic and thermosetting materials come into consideration both for compression molding and for transfer molding.

It is possible both in the case of compression molding and in the case of transfer molding to produce a large number of usually identical articles simultaneously if the mold has more than one mold cavity, it also being possible for a number of mold cavities to be connected to one another by narrow openings in which fins form during molding. In the case of transfer molding, the molding material is then usually introduced into the individual cavities simultaneously from the supply container through a branched feed line (sprue and runner).

In particular when thermosetting materials are used, which as a result of the contact with the hot mold crosslink to an increasing extent as they flow over an increasing distance, or highly viscous thermoplastic materials are used, in particular with a mold that is not heated, the formation of voids (pockets of air or gas resembling bubbles or cracks) can cause flaws in the articles produced. Voids form in particular in regions within the mold cavity that are of a particularly intricate and capillary nature, and in cases where particularly small articles are produced. Voids may represent blemishes, but may also lead to malfunctions of the article produced, for example in the case of semiconductor devices. Various efforts are therefore made to prevent the formation of voids. For example, in the production of plastic packages of semiconductor devices by transfer molding, the air present in the mold cavity is removed through vents during the molding process. A negative pressure of approximately 100 mbar is thereby reached in the mold cavity. It is particularly favorable in this case if the vents are arranged in the wall of the mold cavity that lies opposite the gate, because in this case the air can be removed from the entire flow path of the molding material. The vents are typically in gaps between the two parts of the mold.

This vacuum molding does improve the result of the molding process and reduces the probability of voids forming. However, in return it must be accepted that the molding compound penetrates into the vents and unwelcome bleed edges form as a result on the article produced.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1b illustrates a schematic plan view of the apparatus according to FIG. 1a.

DETAILED DESCRIPTION

Figure 1A:
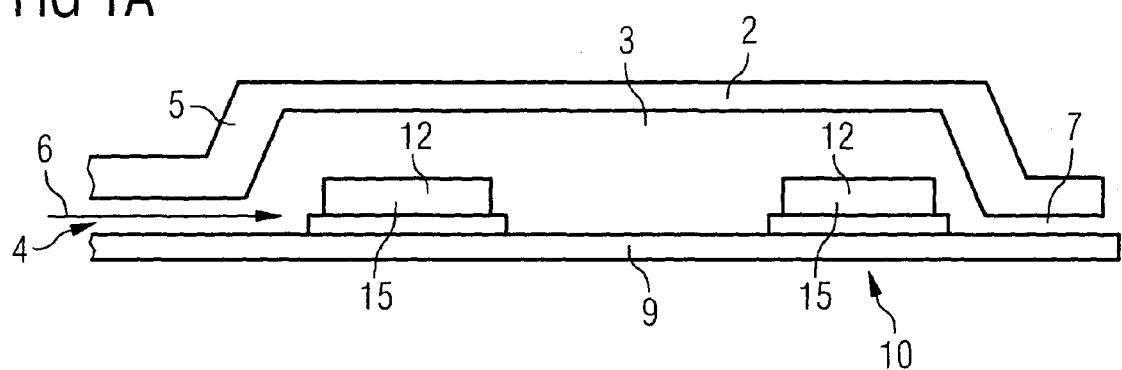
FIG. 1a illustrates schematically in cross section an apparatus for the packaging of semiconductor devices according to the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments of the invention provide an apparatus for producing an article from a thermoplastic or thermosetting material by transfer molding by which the formation of voids, and also the formation of unwelcome bleed edges can be suppressed.

In addition, a further embodiment of the present invention provides a method for producing articles that are as free from voids as possible and also do not have the bleed edges that are unavoidable in the prior art of vacuum molding. Moreover, a method suitable for the packaging of semiconductor devices is to be provided.

One embodiment provides producing an article from a thermoplastic or thermosetting material by transfer molding has a mold with an upper part and a lower part and at least one mold cavity. For the mold cavity, a gate is provided, for introducing the thermoplastic or thermosetting material into the mold cavity. In the closed state of the mold, a vacuum clamping ring is arranged between the upper part and the lower part of the mold.

According to one or more embodiments, conventional vents are no longer necessary. They fill with molding compound and, as a result, undesired bleed edges occur on the article produced. The mold cavity should be evacuable to avoid voids. These two requirements can be met simultaneously by the mold cavity being evacuated not by using conventional vents but by using a vacuum clamping ring that is arranged between the upper and lower parts of the mold, so that the mold can easily be opened for the removal of the article produced.

The apparatus has a device for producing a vacuum in the mold cavity and the mold cavity can be evacuated through the vent in the vacuum clamping ring. In one embodiment, the vents can be closed by a mechanically introduced separating device.

Such an apparatus is also suitable in particular for the packaging of semiconductor devices. In this embodiment, the unpackaged semiconductor device is introduced into the mold cavity individually or in a panel and the mold is closed and evacuated through the vents in the vacuum clamping ring. In the case of wafer molding, the panel takes the form of a wafer with semiconductor chips arranged in a multiplicity of semiconductor device positions.

The mold cavity is partially filled with a thermoplastic or thermosetting material in a softened state, thereby embedding a semiconductor device in the thermoplastic or thermosetting material and constantly maintaining a negative pressure in the mold cavity. Subsequently, the vent is closed and the mold cavity is completely filled. After the curing of the plastic, the packaged semiconductor device is removed from the mold.

One or more embodiments have the avoidance of voids, and can be used without having to accept its disadvantages, in particular the forming of bleed edges due to molding material penetrating into the vents. There is consequently no longer any need for laborious subsequent removal of the bleed edges that are unwelcome, for example, in downstream processes.

According to one or more embodiments, a method for producing an article or a number of articles from a thermoplastic or thermosetting material by transfer molding includes the following processes: first, a mold with an upper part and a lower part and a vacuum clamping ring that is arranged between the upper part and the lower part in the closed state of the mold is provided, the mold having at least one mold cavity with the shape and dimensions of the article to be produced. Furthermore, a thermoplastic or thermosetting material in a softened state is provided.

The closed mold cavity is evacuated through at least one vent arranged in the vacuum clamping ring and is partially filled with a thermoplastic or thermosetting material through a gate. However, before it is filled completely, the vent is closed and only after that is the mold cavity filled completely. Subsequently, the thermoplastic or thermosetting material is cured, so that the mold cavity can be opened and the article produced can be removed.

To speed up the production process, it is possible to evacuate the mold cavity before the introduction of the thermoplastic or thermosetting material with a gas discharge cross section $\rho$ and during the partial filling of the mold cavity with a gas discharge cross section $\rho'$, where $\rho \geq \rho'$. This means that, before the beginning of molding, evacuation is performed very rapidly, possibly through a completely opened vent, whereas during molding evacuation is performed only to the degree necessary, possibly through a partially closed vent, to obtain a sufficiently great negative pressure to avoid the formation of voids in the mold cavity. The evacuation with a great gas discharge cross section before the beginning of molding means that premature closing of the vent, that is to say closing before the molding operation has been fully completed, is not a problem, since an adequately good vacuum is already produced at an early time.

With the method it is possible to produce articles or package semiconductor devices that have neither voids nor unwelcome bleed edges. The rapid evacuation before the beginning of molding even allows the molding operation to be speeded up. Moreover, there is no longer any need for subsequent removal of the bleed edges or removal of possible remains from the conventional vents before the mold is used again. The method according to the invention consequently allows time to be saved while at the same time improving the result.

FIG. 1a illustrates a cross section through an apparatus for the packaging of semiconductor devices, which is also suitable for the production of other articles by molding. The mold 2 has an upper part 5 and a lower part 9, which together enclose a mold cavity 3. For packaging, a number of semiconductor devices 15 in device positions 10 with at least one semiconductor chip 12, which are to be embedded in the plastic package molding compound, are introduced into the mold cavity 3. The thermoplastic or thermosetting plastic package molding compound can be introduced in a softened state into the mold cavity 3 through one or more gates 4. The material, for example in the form of a relatively viscous paste, is thereby injected into the mold cavity 3 in the direction of the arrow 6 and subsequently cured.

Particularly regions in the "lee" of the semiconductor devices 15 and regions in the corners of the mold cavity 3 are at risk from the formation of voids, since it is possible that the relatively viscous material does not completely enclose the semi-conductor devices 15 and forms air pockets behind them. However, other capillary-like regions in the vicinity of the semiconductor devices 15 may also be at risk from the formation of voids, the tendency for voids to form increasing as the path covered by the flow increases or as the molding process progresses. To avoid the formation of voids, the mold cavity 3 is usually evacuated through a number of vents 7 arranged in the edge region of the mold 2. Because molding material at the same time flows into the vents and solidifies there, bleed edges form in the edge region of the molded article and may be unwelcome in downstream processing, possibly even to the extent that they have to be removed.

Figure 1B:
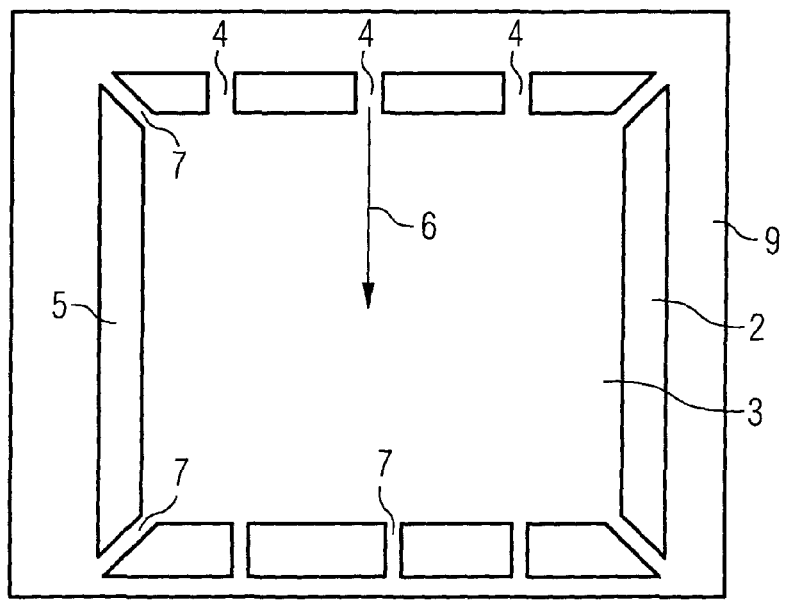

FIG. 1b illustrates a schematic plan view of the apparatus according to FIG. 1a, only the side walls of the upper part 5 of the mold 2 being represented. This illustrates a possible arrangement of vents 7 in the region of the wall lying opposite the gate 4 and in corner regions.

Figure 2:
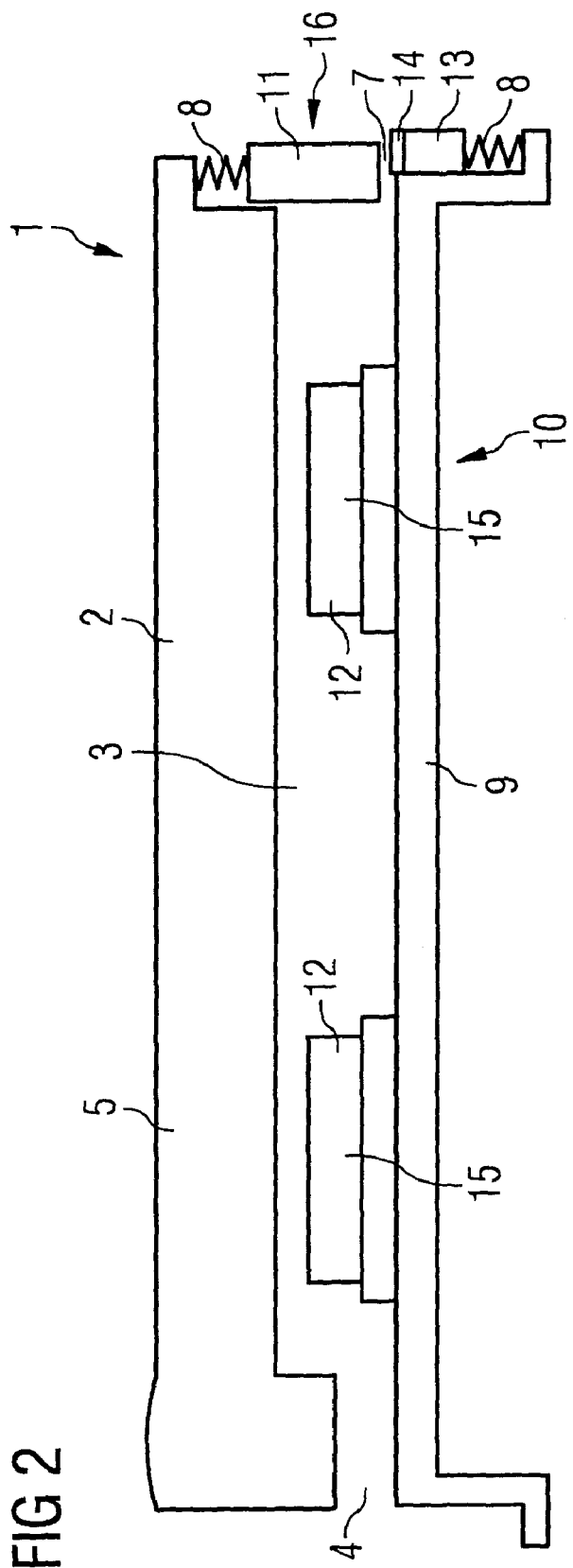
FIG. 2 illustrates schematically in cross section an apparatus for the packaging of semiconductor devices.

FIG. 2 illustrates an apparatus 1 for packaging semiconductor devices. By contrast with the known apparatus, represented in FIG. 1, the apparatus 1 has one or more vents 7 that can be closed by a vacuum clamping ring 16. The vacuum clamping ring 16, which permits both complete closing and partial closing of the vent 7, has in one embodiment represented a first element 11, assigned to the upper part 5 of the mold 2, and a second element 13, assigned to the lower part 9 of the mold 2. The first element 111 and the second element 13 may be fastened to spring elements 8, by which closing of the vent 7 can be performed and controlled. The force transmission to the first element 11 and the second element 13 may, however, also take place in some other way. For example, the second element 13 is a vacuum sealing ring provided with a seal 14.

When packaging semiconductor devices, the mold 2 is first opened, the upper part 5 typically being swung down from or taken off the lower part 9. The unpackaged semiconductor devices are introduced into the open mold 2 individually or in a panel and the mold 2 is closed. Before the thermoplastic or thermosetting material is introduced, the open vacuum clamping ring 16 provides access to a number of vents 7, through which the mold cavity 3 is by and large evacuated with a relatively great gas discharge cross section ρ by a vacuum pump (not represented). Subsequently, the polymer material is introduced into the mold cavity 3 through the gate 4 and the semiconductor devices 15 are embedded in it. At first, however, the mold cavity 3 is only filled partially, but typically to a great extent. During the partial filling of the mold cavity 3, air continues to be pumped out from the mold cavity 3 through the vents 7 that are open or partially closed by the vacuum clamping ring 16, but with a gas discharge cross section ρ', which is less than ρ. As a result, controlled filling of the mold cavity 3 is achieved.

When the mold cavity 3 is filled as completely as possible, but at a sufficient time before polymer compound penetrates into the vents 7, the vent 7 is closed completely and in a sealed manner with the vacuum clamping ring 16. It remains closed until after the curing of the polymer compound. This ensures that the vents 7 remain free from polymer compound and no unwelcome bleed edges occur. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus suitable for use with semiconductor devices comprising:
   a mold having a first part and a second part, and having a mold cavity and a gate for introducing material into the mold cavity; and
   a vacuum clamping ring having at least one closable vent for evacuating the mold cavity, wherein the vacuum clamping ring is arranged between the first part and the second part and includes a first moveable element assigned to the first part and a second moveable element assigned to the second part which together control a cross-sectional area of the at least one closable vent, including closing the at least one closable vent.

2. The apparatus of claim 1, comprising:
   the mold having a closed position and an open position, where the vacuum clamping ring is configured to be positioned between the first part and the second part when the mold is in the closed position.

3. The apparatus of claim 1, comprising:
   a vacuum device configured to produce a vacuum in the mold.

4. The apparatus of claim 3, comprising:
   where the mold is configured such that the vacuum device operated to evacuate the mold via the vent.

5. The apparatus of claim 1, comprising:
   where the mold is configured as a semiconductor packaging device.

6. The apparatus of claim 1, comprising:
   a mold cavity; and
   a semiconductor device operably positioned within the mold cavity.

7. An apparatus for producing one or more articles from a thermoplastic or thermosetting material by transfer molding, which apparatus comprises:
   a mold with an upper part;
   a lower part;
   at least one mold cavity, the mold cavity having a gate for introducing a thermoplastic or thermosetting material into the mold cavity; and
   a vacuum clamping ring with at least one closable vent for evacuating the mold cavity, wherein the vacuum clamping ring is arranged between the upper part and the lower part in a closed state of the mold and includes a first moveable element assigned to the upper part and a second moveable element assigned to the lower part which together control a cross-sectional area of the at least one closable vent, including closing the at least one closable vent.

8. The apparatus of claim 7, comprising where the apparatus is configured for packaging semiconductor devices.

9. The apparatus of claim 7, comprising:
   a device for producing a vacuum in the mold cavity via the vent.

10. An apparatus suitable for use with semiconductor devices comprising:
    a mold having a first part and a second part and having an open and a closed position and forming a mold cavity when in the closed position; and
    a vacuum clamping ring means having at least one closable means for venting for evacuating the mold cavity, wherein the vacuum clamping ring means is arranged between the first part and the second part and positioned between the first part and the second part when the mold is in the closed position, and wherein the vacuum clamping ring means includes a first moveable element assigned to the first part and a second moveable element assigned to the second part which together control a cross-sectional area of the at least one closable means for venting.

11. An apparatus for packaging semiconductor devices comprising:
    an upper mold part;
    a lower mold part, wherein the upper and lower mold parts together, when in a closed position, form a mold cavity having at least one gate opening through which a molding compound is pumped into the mold cavity; and
    a vacuum clamping ring arranged between the upper and lower mold parts and having at least one vent opening from the mold cavity for evacuating the mold opening which is formed by a first movable element assigned to the upper mold part and a second moveable element assigned to the lower mold part, wherein the first and second movable elements are movable relative to one another so as to control a cross-sectional area of the at least one vent opening, including closure of the vent opening.

* * * * *